SEMICONDUCTOR NETWORKS

Original Filed Feb. 6, 1961 2 Sheets-Sheet 1

INVENTORS
Jack S. Kilby,
Jay W. Lathrop
BY John G. Graham
ATTORNEYS

SEMICONDUCTOR NETWORKS

Original Filed Feb. 6, 1961 2 Sheets-Sheet 2

INVENTORS
Jack S. Kilby,
Jay W. Lathrop
BY John D. Graham
ATTORNEYS

United States Patent Office 3,211,972
Patented Oct. 12, 1965

3,211,972

SEMICONDUCTOR NETWORKS

Jack S. Kilby and Jay W. Lathrop, Dallas, Tex., assignors to Texas Instruments Incorporated, Dallas, Tex., a corporation of Delaware Continuation of application Ser. No. 87,258, Feb. 6, 1961. This application June 24, 1964, Ser. No. 377,710
7 Claims. (Cl. 317—235)

This invention relates to single crystal semiconductor networks, and more particularly to semiconductor networks which include as an integral part an epitaxial semiconductor layer.

This application is a continuation of our copending application, Serial No. 87,258, filed Feb. 6, 1961, now abandoned.

In modern-day electronic packaging, the need for small as well as light-weight electronic devices has become critical. The discovery of the various semiconductor devices such as the transistor and the tunnel diode has made it possible for circuit designers to achieve component densities several orders of magnitude higher than was possible using the vacuum tube circuit components. However, in many applications the size and weight of many electronic systems utilizing the semiconductor devices is much greater than is desired or can be tolerated.

In the co-pending application of Jack S. Kilby, Serial No. 791,602, there is disclosed a unique integrated electronic circuit fabricated from single crystal semiconductor material. As described in this co-pending application, circuit modules comprising several different circuit components such as transistors, diodes, resistors and capacitors are fabricated from a single crystal semiconductor structure. These circuit modoules are referred to as semiconductor networks and for the purposes of this application a semiconductor network is defined as a single crystal semiconductor structure including at least two interconnected circuit components of different types.

The discovery of these semiconductor networks constituted a major breakthrough in the field of circuit miniaturization in that the entire electronic circuit modules, such as multivibrators, amplifiers or oscillators in a space and of a weight usually allocated to one transistor are available.

Many of these semiconductor networks, however, fail to function as well as the same circuit modules comprising individual components and compromises must be made between the desired reduction in size and weight and the desired circuit characteristics and capabilities. The reason many of the semiconductor networks of the prior art fail to perform as well as their counterparts made from individual components is that the components of each semiconductor network are all formed from the same single crystal of semiconductor material. The transistors, diodes and capacitors are all made by diffusing impurities into this crystal and resistors are made by using the resistivity of the semiconductor material of this crystal. Thus the original characteristics of this crystal affects the properties of all the circuit components that are formed therein. The disadvantage of this fact is that for some components it may be desirable to have one characteristic in some portions of the crystal and for others it may be desirable to have the opposite. For example, for resistors it is usually desirable that the resistivity of the semiconductor material be high because higher resistances may be obtained and a given resistance can be obtained in a shorter dimension. On the other hand, it is usually desirable that transistors be formed out of relatively low resistivity material in that in this manner a low saturation voltage is achieved and collector storage is reduced. When such conflicting desires for the characteristics of the crystal of a semiconductor network occur, a compromise must be made resulting in the reduction of the operating quality of the circuit module.

This problem is overcome according to the concept of the present invention by growing an epitaxial layer onto the original single crystal. This epitaxial layer will be a continuation of the single crystal and its characteristics may be selected to be whatever is desired. Thus its resistivity may be selected to be much lower than that of the original crystal portion and the transistors of a semiconductor network may be formed in this layer while the high resistance original material can be used to provide the resistors. This technique of growing an epitaxial layer also permits heavier doped regions to be buried beneath more lightly doped regions because impurities may be diffused in regions of the original material before the epitaxial layer is grown. This feature enables much higher resistivity material to be used to form the resistors than was heretofore practical because of the difficulty in getting a good ohmic contact with high resistivity semiconductor material. A good ohmic contact can be obtained to high resistivity semiconductor material by the use of a low resistivity epitaxial layer grown on top of a heavily doped region in the high resistivity semiconductor material.

It is therefore the principal object of this invention to provide improved semiconductor networks.

It is another object of this invention to incorporate an epitaxial region as part of a semiconductor network.

It is a further object of this invention to permit more selectivity of the characteristics of different regions of a semiconductor network.

It is a still further object of this invention to permit heavier doped regions to be buried under more lightly doped regions.

It is a still further object of this invention to make possible the use of very high resistivity material for one part of a semiconductor network while using a very low resistivity material for another part of a semiconductor network.

It is a still further object of this invention to facilitate the obtaining of a good ohmic contact to high resistivity semiconductor material.

Further objects and advantages of the present invention will become apparent as the following detailed description of preferred embodiments of the invention unfold and when taken in conjunction with the drawings, wherein.

Figures 1, 2, 3, 4, 5:
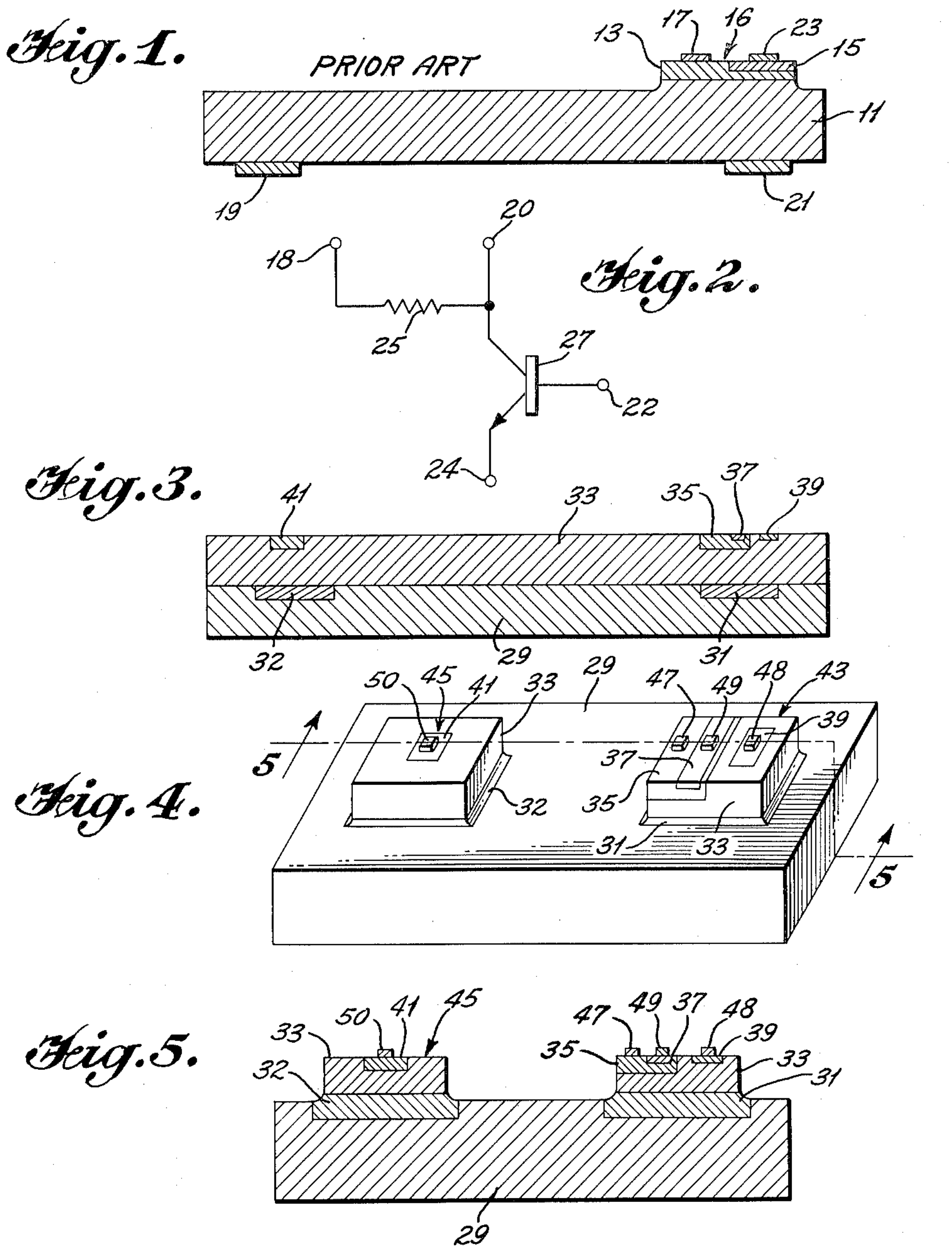
FIGURE 1 shows in cross section a semiconductor network of the prior art.
FIGURE 2 is a diagram of a circuit provided by the semiconductor network of FIGURE 1.
FIGURE 3 is a cross-sectional showing of an intermediate stage in the manufacture of a semiconductor network according to the concept of the present invention providing the circuit of FIGURE 2.
FIGURE 4 is a view in perspective of a semiconductor network according to the present invention providing the circuit of FIGURE 2.
FIGURE 5 is a cross section through the semiconductor network of FIGURE 4 along the lines 5—5.

The semiconductor network of the prior art illustrated in FIGURE 1 comprises a single crystal 11 of relatively high resistivity semiconductor material such as silicon. In the illustrative example of FIGURE 1 the crystal 11 has an N-type conductivity and a resistivity of 10 ohm-centimeters. At one end of the block 11 a region 13 of P-type conductivity is formed by solid state diffusion and a heavily doped region 15 of N-type conductivity is formed by solid state diffusion in the region 13. The top of the block 11 is etched to leave a mesa 16 including the region 13 and the region 15 projecting up from the main body of the block 11. The PN junctions between the N-type conductivity region 15 and the remaining P-type conductivity material of the region 13 and between the remaining N-type conductivity material of the block 11 and the P-type conductivity material of the region 13 form an NPN transistor in the mesa 16 with the P-type conductivity material of the region 13 providing the base, the region 15 providing the emitter and the remaining N-type conductivity material of the block 11 providing the collector. An ohmic contact 17 is provided to the P-type conductivity material of the region 13 and acts as the base electrode of the transistor. An ohmic contact 21 to the block 11 directly beneath the mesa 16 provides the collector electrode of the transistor, and an ohmic contact 23 to the heavily doped region 15 provides the emitter electrode of the transistor. At the opposite end of the block 11 from the mesa 16, an ohmic contact 19 is provided. The relatively high resistivity material between the contacts 19 and 21 in the block 11, in effect, provides a resistor connected to the collector of the transistor in the mesa 16.

FIGURE 2 illustrates schematically the circuit provided by the semiconductor network of FIGURE 1. As shown in FIGURE 2, a resistor 25 is connected between a terminal 18 and the collector of an NPN transistor 27. A terminal 24 is connected to the emitter of the transistor 27, a terminal 22 is connected to the base of the transistor 27, and a terminal 20 is connected to the collector of the transistor 27, or in other words to the junction between the resistor 25 and the collector of the transistor 27. The resistor 25 is provided by the resistivity of the semiconductor material between contacts 19 and 21 and the transistor 27 is provided by the transistor of the mesa 16. The terminals 18, 20, 22 and 24 are provided by the contacts 19, 21, 17 and 23 respectively. Because of the difficulty of forming ohmic contacts on high resistivity material, as a practical matter the resistivity of the block 11 is limited to 10 ohm-centimeters. As a result, the resistor 25 provided by the block 11 has a maximum value of 40,000 ohms in a practical embodiment of this semiconductor network. Furthermore, the use of material of even this high resistivity in the block 11 has resulted in several serious compromises in the design of the transistor 27. Because the relatively high resistivity material of the block 11 provides the collector of the transistor 27, the transistor 27 will have a relatively high value of saturation voltage. This high saturation voltage is undesirable, particularly when the transistor 27 is to be used in a switching application. For in a switching application it is desired that when the transistor 27 is conducting or turned on, the transistor will act as nearly as possible as a short circuit. Because the transistor 27 has a relatively high saturation voltage, it will have a relatively high voltage between its collector and emitter when it is conducting or turned on and thus, will not approach the desired short circuit. Furthermore, the relative high resistivity of the collector of the transistor 27 provided by the block 11 also permits increased collector storage, which results in a considerably slower switching time for the device.

The present invention enables the circuit of FIGURE 2 to be provided by a semiconductor network in which a much higher resistivity material provides the resistor 25, thus obtaining a much higher resistance for the resistor 25, whereas the collector region of the transistor 27 is provided by a much lower resistivity material. The improved semiconductor network providing the circuit of FIGURE 2 according to the present invention is illustrated in FIGURES 3 through 5.

As shown in FIGURE 3, which illustrates the semiconductor network in an intermediate stage of manufacture, a high resistivity single crystal of semiconductor material in wafer form designated by the reference number 29 is provided. In the embodiment of FIGURES 3–5, the wafer 29 will have a resistivity of 100 ohm-centimeters and is of N-type conductivity. Two heavily doped N-type regions 31 and 32 (about 0.1 ohm-centimeter or less) are diffused into the top surface of the wafer 29 at opposite ends thereof. On top of the wafer 29 an epitaxial layer 33 of semiconductor material is grown. The layer 33 will be a continuation of the single crystal, which is essential. One way to produce this epitaxial layer is to vapor deposit semiconductor material on the crystal wafer 29 in accordance with the disclosure in "Epitaxial Growth of Silicon" by Wajda et al. IBM Journal of Research and Development, 4, pages 288–295 (1960) and "Impurity Introduction During Epitaxial Growth of Silicon" by Glang et a.l IBM Journal of Research and Development, 4, pages 299–301 (1960). The characteristics, including the resistivity and the conductivity type of the epitaxial layer, can be freely selected. In the embodiment of FIGURE 3 the conductivity is selected to be of N-type and the resistivity is selected to be relatively low, and preferably between 0.5 and 1.0 ohm-centimeter. A P-type region 35 is formed in the N-type epitaxial layer 33 by solid state diffusion. This region 35 is formed over the heavily doped N-type region 31 in the wafer 29. A heavily doped N-type region 37 is formed in the P-type region 35 by solid state diffusion. Also a heavily doped N-type region 39 is formed in the N-type material of the layer 33 alongside of the region 35 by solid state diffusion and a heavily doped N-type region 41 is formed in the layer 33 over the N-type region 32 by solid state diffusion. The epitaxial layer 33 is then etched to leave the mesas designated generally in FIGURES 4 and 5 by the reference numbers 43 and 45. The layer 33 is etched entirely away so that the mesas 43 and 45 are joined only by the high resistivity material of the wafer 29. The etching is carried out so that the mesa 43 contains the P-type region 35 with the N-type region 37 therein and also the heavily doped N-type region 39 and the mesa 45 contains the heavily doped N-type region 41. The regions in the mesa 43 form a transistor with the N-type region 37 providing the emitter, the P-type material of the region 35 providing the base, and the remaining N-type material of the layer 33 in the mesa 43 providing the collector. The heavily doped N-type region 39 in the mesa 43 is used to provide a contact to the collector of the transistor. An ohmic contact 49 is made to the heavily doped N-type region 37 to provide the emitter electrode, an ohmic contact 47 is made to the remaining P-type material in the region 35 to provide the base electrode, and an ohmic contact 48 is made to the region 39 to provide the collector electrode. An ohmic contact 50 is made to the heavily doped region 41. This semiconductor network shown in FIGURES 4 and 5 will provide the circuit illustrated in FIGURE 2 with the mesa 43 providing the transistor 27 and with the semiconductor material between the mesas 45 and 43 providing the resistor 25. The terminals 18, 20, 22 and 24 are provided by the contacts 50, 48, 47 and 49, respectively. Because high resistivity material is used for the wafer 29, the resistance of the resistor 25 may be made much higher and also the wafer 29 does not have to be made nearly as long to provide an adequately high resistance. Furthermore, the resistivity of the collector region of the transistor 27 is substantially reduced since this collector region is provided by the epitaxial layer 33 which has a relatively low resistivity. Thus, the transistor 27 will have a low saturation voltage permitting it to act more as a short circuit when it is switched on and also it will have greatly reduced collector storage resulting in a much faster switching time for the transistor 27. Furthermore, the provision of the heavily doped region 41 in the low resistivity epitaxial layer in the mesa 45 formed on the heavily doped region 32 in the high resistivity base permits a good ohmic contact to the high resistivity material. Similarly, the heavily doped region 31 makes a good ohmic contact between the collector region of the transistor and the high resistivity material of the wafer 29 and also limits depletion layer width in the collector noticeably improving switching characteristics of transistor. Thus, all of the problems discussed above associated with the semiconductor network of the prior art illustrated in FIGURE 1 are overcome by the use of the epitaxial layer 33 in forming the semiconductor network.

As illustrated in FIGURE 3, the epitaxial layer permits a heavily doped reigon such as the regions 31 and 32 to be completely surrounded in a single crystal structure by material that is more lightly doped. In the embodiment in FIGURES 4 and 5, these buried regions 31 and 32 permit good ohmic contact to be made to the high resistivity material of the wafer 29. It will be obvious that this structure will have many other applications in semiconductor networks and the achievement of this structure vastly widens the horizon in the technology of this field.

Figure 6:
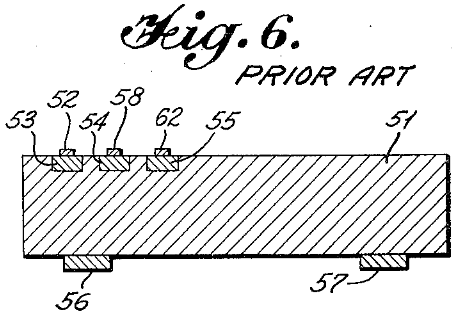
Fig. 6. PRIOR ART
FIGURE 6 illustrates in cross section a semiconductor network of the prior art providing a three-way AND gate.
Figure 7:
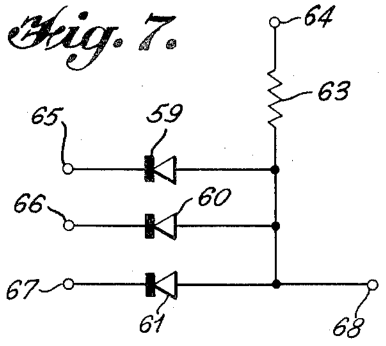
FIGURE 7 is a diagram of the circuit provided by the semiconductor network of FIGURE 6.

In FIGURE 6 there is illustrated another semiconductor network of the prior art. This semiconductor network comprises an AND gate, the circuit of which is shown in FIGURE 7. The semiconductor network of FIGURE 6 comprises a single crystal block 51 of semiconductor material of P-type conductivity. Near one end of this block three regions of N-type conductivity are formed by solid state diffusion. These three regions are designated by the reference numbers 53 through 55 in FIGURE 6. The junction between the regions of N-type material 53 through 55 and the P-type material of the block 51 form semiconductor diodes. An ohmic contact 56 is made to the block 51 beneath the regions 53 through 55 and an ohmic contact 57 is made to the opposite end of the base 51. Ohmic contacts 52, 58 and 62 are made to the N-type regions 53, 54 and 55, respectively. The resistivity of the block 51 between the ohmic contacts 57 and 56 provides a resistor. Thus, the semiconductor network shown in FIGURE 6 provides an AND gate, the circuit of which is illustrated in FIGURE 7. In this circuit a resistor 63 is connected between a terminal 64 and three diodes 59 through 61, which connect the resistor 63 to terminals 65 through 67, respectively. A terminal 68 is connected to the junction between the diodes 59 through 61 and the resistor 63. The three diodes 59 through 61 are the diodes formed by the junctions of the N-type regions 53 through 55 with the P-type material of the block 51 and the resistance 63 is provided by the resistivity of the block 51 between the contacts 57 and 56. The terminals 64 through 68 are provided by the contacts 57, 62, 58, 52 and 56 respectively. Thus, the semiconductor network shown in FIGURE 6 provides a three input AND gate.

As in the case with the transistor-resistor combination, the AND gate of FIGURE 6 has the limitation that the resistivity of the P-type material of the block 51 cannot be made very high because the ohmic contacts 56 and 57 must be formed therewith, and as pointed out above it is very difficult to get a good ohmic contact to high resistivity material. Furthermore, if the resistivity of the material of the block 51 is made too high, the diodes 59 through 61 in the circuit of FIGURE 7 will, in effect, instead of having a direct connection to the resistor 63, each be connected to the resistor 63 through a series resistor. With such series resistors included in the circuit of FIGURE 7 the operation of the circuit as an AND gate would be seriously impaired. Therefore, to get an adequately high resistance for the resistor 63, the block 51 must be made relatively long.

Figure 8:
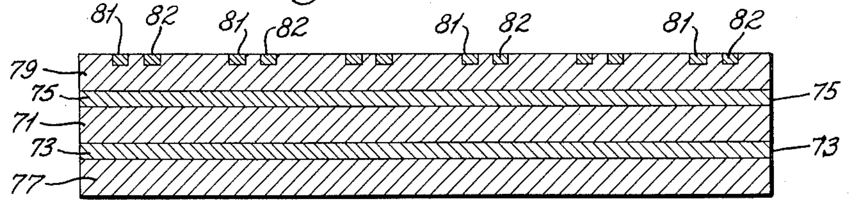
FIGURE 8 is a cross-sectional showing of an intermediate stage in the manufacture of a semiconductor network according to the present invention providing the circuit of FIGURE 7.
Figure 9:
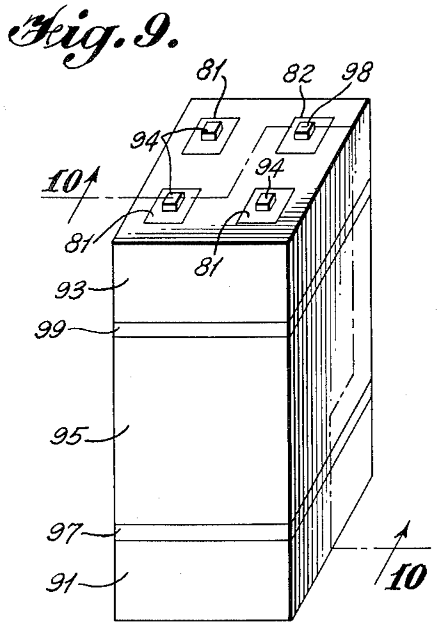
FIGURE 9 is a view in elevation of a semiconductor network according to the present invention providing the circuit of FIGURE 7.
Figure 10:
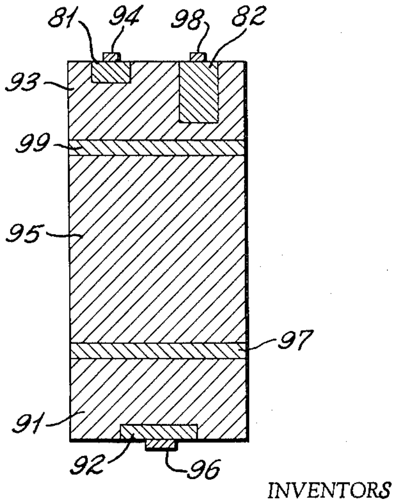
FIGURE 10 a cross section through the semiconductor network of FIGURE 9 along the lines 10—10.

With the concept of the present invention of making part of the semiconductor network, an epitaxial layer which is grown on an original single crystal, these problems can be overcome. FIGURES 8–10 illustrate a semiconductor network according to the present invention providing the AND gate of FIGURE 7.

FIGURE 8 illustrates an intermediate stage in the manufacture of this semiconductor network. As shown in FIGURE 8 a single crystal wafer 71 having a high resistivity and a P-type conductivity is provided. On each side of this wafer, heavily doped N-type regions 73 and 75 (about 0.1 ohm-centimeter or less) are formed by solid state diffusion. Then on top of the heavily doped regions 73 and 75, on each side of the wafer 71, epitaxial layers 77 and 79 are grown. These epitaxial layers are as continuations of the semiconductor single crystal structure, selected to have relatively low resistivities, and to be of P-type conductivity. In the epitaxial layer 79 a plurality of small regions of N-type material are formed by solid state diffusion. These regions 81 are arranged in groups of three. With each group of three regions 81 of N-type material a region 82 of heavily doped P-type material is formed by solid state diffusion. The structure of FIGURE 8 is then diced so that each group of three regions 81 with one region 82 will be in a separate crystal portion. FIGURES 9 and 10 illustrate one of the portions resulting after the dicing operation. As shown in these figures, the crystal portion or unit comprises a bar of semiconductor material at the ends of which are epitaxial layers 91 and 93 of P-type material. Between the epitaxial layers 91 and 93 is a bar 95 of high resistivity P-type material. The epitaxially grown layers 91 and 93 are joined to the high resistivity P-type material by the heavily doped regions 97 and 99. In the epitaxial layer 93 are three regions of N-type material 81 and one region 82 of heavily doped P-type material. The three regions 81 of N-type material form three diodes with the P-type material of the epitaxial layer 93. A region 92 of heavily doped P-type material is formed in the epitaxial layer 91 by solid state diffusion. Ohmic contacts 94 are made to the N-type regions 81, an ohmic contact 98 is made to the heavily doped P-type region 82, and an ohmic contact 96 is made to the heavily doped P-type region 92. This structure shown in FIGURES 9 and 10 will provide the AND gate circuit shown in FIGURE 7. The diodes 59 through 61 are provided by the junctions between the N-type regions 81 and the epitaxial layer 93 of P-type material and the resistor 63 is provided by the high resistivity P-type material between the epitaxial layers 93 and 91. The terminals 65 through 67 are provided by the contacts 94, the terminal 68 is provided by the contact 98, and the terminal 64 is provided by the contact 96. Because the resistor 63 is provided by a high resistivity material, it is possible to form it with such a short length of the material that the width of a semiconductor wafer is sufficient. For this reason the AND gates may be produced by dicing a wafer in the manner described with reference to FIGURE 8. The fact that the epitaxial layers 93 and 91 are provided on each end of the high resistivity bar 95 permits these regions 91 and 93 to be of low resistivity. Thus, virtually no resistance will appear between the diodes 59 through 61 and the resistor 63 in the circuit of FIGURE 7 and good ohmic contacts are made to the high resistivity bar 95. With some crystal growing processes it may be desirable to grow only layer 93 and to form the region 92 by diffusing directly into layer 95.

If further increases in transistor speed are required in semiconductor networks, the epitaxial layer can be doped during its growth with a lifetime killing agent such as gold. Doping during growth provides a nearly constant dope level throughout the epitaxial layer. This is a great improvement over the error function distribution currently obtained by conventional solid state diffusion processes. This technique is also of considerable value for individual transistors as well as semiconductor networks.

From the above description of the invention it will be seen that the basic concept of the applicants' invention is making use of an epitaxial layer as an integral part of a semiconductor network. The techniques of the present invention are applicable to many semiconductor networks other than those described above and many modifications may be made to these specific embodiments without departing from the spirit and scope of the invention.

What is claimed is:

1. An integrated circuit comprising a monocrystalline semiconductor substrate, a layer of epitaxial semiconductor material overlying at least a portion of one face of the substrate, a circuit component defined in a part of the epitaxial layer by thin, limited area, surface-adjacent regions of alternate conductivity type, and means for making low resistance electrical connection to a portion of the epitaxial layer which underlies said regions, said means comprising a heavily doped layer of the semiconductor material interposed between the epitaxial layer and the substrate, and a contact on the top surface of the epitaxial layer above a part of the heavily doped layer.

2. In a semiconductor device of the type having diverse circuit components in a monocrystalline body of semiconductor material, a semiconductor substrate heavily doped semiconductor material of one conductivity type at one face of the substrate, epitaxially-grown semiconductor material of said one conductivity type overlying the heavily doped semiconductor material on said one face of the substrate, substantial electrical impedance being exhibited through the body between portions of the heavily-doped semiconductor material and between portions of the epitaxially-grown semiconductor material, a circuit component formed in the surface of at least one of such portions of the epitaxially-grown semiconductor material by thin, limited area, regions of alternate conductivity-type, and a low resistance connection to the portion of the epitaxially-grown region subjacent said regions, said low resistance connection comprising a contact on the epitaxially-grown region at said one face spaced from said regions and a low resistance path through the heavily doped semiconductor material subjacent said portion.

3. A transistor comprising a monocrystalline semiconductor substrate, a heavily doped layer of monocrystalline semiconductor material of one conductivity type adjacent one face of the substrate, an epitaxially grown region of monocrystalline semiconductor material of said one conductivity type on said one face overlying said heavily doped layer, a base region of the opposite conductivity type formed in said epitaxially grown region above said heavily doped region but spaced therefrom, the portion of the epitaxially grown region immediately underlying said base region providing the collector of the transistor, an emitter region of said one conductivity type on said one face formed in said base region above said portion of the epitaxially grown region but spaced therefrom, separate electrical contacts to the emitter and base regions on said one face, and a collector connection on said one face comprising a contact overlying said epitaxially grown region with a low resistance path to said portion being provided in a direction generally parallel with said one face by said heavily doped layer.

4. A transistor comprising a semiconductor substrate, a heavily doped layer of monocrystalline semiconductor material of one conductivity type adjacent one face of the substrate, a lightly doped region of monocrystalline semiconductor material of said one conductivity type on said one face overlying said heavily doped layer, a base of the opposite conductivity type formed in said region above said heavily doped layer but spaced therefrom, the portion of said region immediately underlying said base providing the collector of the transistor, and emitter of said one conductivity type on said one face formed in said base above said portion of said region but spaced therefrom, separate electrical contacts to the emitter and base on said one face, and a collector connection on said one face comprising a contact overlying said region with a low resistance path to said portion being provided in a direction generally parallel with said one face by said heavily doped layer.

5. In an integrated circuit, a semiconductor substrate, a layer of epitaxial semiconductor material overlying at least a portion of one face of the substrate, a circuit component defined in a part of the epitaxial layer and including thin surface-adjacent regions of alternate conductivity type, and means for making low resistance electrical connection to a portion of the epitaxial layer which underlies said regions, said means comprising a heavily doped layer of the semiconductor material interposed between the epitaxial layer and the substrate, and a contact on the top surface of the epitaxial layer above a part of the heavily doped layer.

6. In a semiconductor device of the type having diverse circuit components in a unitary structure, a semiconductor substrate, heavily doped semiconductor material of one conductivity type adjacent one face of the substrate, relatively lightly doped semiconductor material of said one conductivity type overlying the heavily doped semiconductor material adjacent said one face of the substrate, substantial electrical impedance being exhibited through the substrate between portions of the heavily doped semiconductor material and between portions of the lightly doped semiconductor material, a circuit component formed in the surface of at least one of such portions of the lightly doped semiconductor material by thin, limited area, regions of alternate conductivity type, and a low resistance connection to the portion of the lightly doped region subjacent said regions of alternate conductivity type, said low resistance connection comprising a contact on the lightly doped region adjacent said one face spaced from said regions of alternate conductivity type and a low resistance path through the heavily doped semiconductor material subjacent said portion.

7. In a semiconductor device of the type having diverse circuit components in a unitary structure: a substrate composed of high resistance silicon and having a major face, a plurality of monocrystalline regions of relatively lightly doped silicon of one type conductivity adjacent said major face, relatively heavily doped silicon of said one type adjacent said major face interposed between said regions and said substrate, substantial electrical impedance being exhibited through the substrate between portions of the heavily doped silicon and between regions of the lightly doped silicon, a transistor formed in the surface of one of the regions of lightly doped silicon by a thin base region of the opposite type and a thin emitter region of said one type, separate electrical connections to the base and emitter regions on said major face, the portion of said region of lightly doped silicon immediately underlying said base region providing the collector of the transistor, and a collector connection on said major have comprising a contact overlying said region of lightly doped silicon spaced from said base region with a low resistance path to said collector being provided in a direction generally parallel to said major face by said heavily doped silicon.

References Cited by the Examiner

UNITED STATES PATENTS

| | | | |
|---|---|---|---|
| 3,089,794 | 5/63 | Marinace | 148—175 |
| 3,149,395 | 9/64 | Bray et al. | 29—25.3 |

OTHER REFERENCES

Theuerer et al.: Article in Proceeding of the IRE, Sept. 1, 1960, pages 1642–1643.

Van Ligten: "Epitaxially Diffused Transistor Fabrication," IBM Technical Disclosure Bulletin, vol. 4, No. 10, March 1962, pages 58–59.

DAVID J. GALVIN, *Primary Examiner.*

DAVID L. RECK, *Examiner.*